(12) United States Patent
Shin et al.

(10) Patent No.: US 11,710,793 B2
(45) Date of Patent: Jul. 25, 2023

(54) TFT SUBSTRATE AND DISPLAY DEVICE INCLUDING THE SAME

(71) Applicant: LG Display Co., Ltd., Seoul (KR)

(72) Inventors: Dong-Chae Shin, Paju-si (KR);
Won-Sang Ryu, Paju-si (KR);
Kyung-Mo Son, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 22 days.

(21) Appl. No.: 16/418,406

(22) Filed: May 21, 2019

(65) Prior Publication Data

US 2019/0363194 A1 Nov. 28, 2019

(30) Foreign Application Priority Data

May 25, 2018 (KR) .......................... 10-2018-0059462

(51) Int. Cl.
*H01L 29/786* (2006.01)
*H01L 27/12* (2006.01)
(Continued)

(52) U.S. Cl.
CPC ...... *H01L 29/78675* (2013.01); *H01L 27/124* (2013.01); *H01L 27/1222* (2013.01); *H01L 29/0847* (2013.01); *H01L 29/66757* (2013.01)

(58) Field of Classification Search
CPC ......... H01L 29/1033; H01L 29/06–063; H01L 29/786–78696; H01L 29/66742–6678;
(Continued)

(56) References Cited

U.S. PATENT DOCUMENTS

| 6,506,669 | B1 * | 1/2003 | Kuramasu | ......... | H01L 29/78678 |
|||||| 257/E21.414 |
| 2001/0038098 | A1 * | 11/2001 | Yamazaki | ........... | H01L 27/3211 |
|||||| 257/72 |

(Continued)

FOREIGN PATENT DOCUMENTS

| CN | 101071816 A | 11/2007 |
| CN | 101097367 A | 1/2008 |

(Continued)

OTHER PUBLICATIONS

Machine translation of KR 10-2007-0114880, translated Jul. 15, 2020 (Year: 2020).*

(Continued)

*Primary Examiner* — Lauren R Bell
(74) *Attorney, Agent, or Firm* — Seed IP Law Group LLP

(57) ABSTRACT

A thin film transistor (TFT) substrate includes a TFT on the substrate. The TFT includes an active patterned layer which is made of a polycrystalline silicon, which includes a channel portion, a source portion and a drain portion, and in which protrusions are formed at boundaries between grains and recess spaces are formed between the protrusions. A barrier pattern film fills the recess spaces and forms a flat surface with the protrusions. A gate electrode is on a gate insulating layer located on the barrier pattern film and the protrusions and overlays or corresponds to the channel portion. A source electrode and a drain electrode are on the gate electrode and respectively contact the source portion and the drain portion.

25 Claims, 5 Drawing Sheets

(51) Int. Cl.
*H01L 29/08* (2006.01)
*H01L 29/66* (2006.01)

(58) Field of Classification Search
CPC . H01L 27/3241–3297; H01L 21/02647; H01L 27/124; H10K 59/131
See application file for complete search history.

(56) References Cited

U.S. PATENT DOCUMENTS

| | | | |
|---|---|---|---|
| 2004/0038600 A1* | 2/2004 | Miyazawa | G02F 1/1368 439/894 |
| 2008/0035933 A1* | 2/2008 | Nagata | H01L 29/78606 257/E29.151 |
| 2008/0315207 A1* | 12/2008 | Yang | H01L 29/4908 257/E29.151 |
| 2016/0233253 A1* | 8/2016 | Kim | H01L 27/1274 |

FOREIGN PATENT DOCUMENTS

| | | | |
|---|---|---|---|
| CN | 102842509 A | | 12/2012 |
| JP | 2000124457 A | * | 4/2000 |
| JP | 2009267198 A | * | 11/2009 |
| KR | 10-2007-0114880 A | | 12/2007 |
| KR | 10-0879040 B1 | | 1/2009 |
| KR | 2016-0082558 A | | 7/2016 |
| KR | 10-2018-0018974 A | | 2/2018 |

OTHER PUBLICATIONS

Machine translation of JP2009267198, translated Dec. 3, 2021 (Year: 2009).*

* cited by examiner

TFT SUBSTRATE AND DISPLAY DEVICE INCLUDING THE SAME

CROSS REFERENCE TO RELATED APPLICATIONS

The present application claims the priority benefit of Korean Patent Application No. 10-2018-0059462 filed in Republic of Korea on May 25, 2018, which is hereby incorporated by reference in its entirety for all purposes as if fully set forth herein.

BACKGROUND

Technical Field

The present disclosure relates to a thin film transistor (TFT) substrate and a display device including the same.

Description of the Related Art

Generally, a thin film transistor (TFT) substrate is used for a flat display device such as a liquid crystal display device (LCD), an organic light emitting diode (OLED) display device, or the like.

A TFT uses an amorphous silicon or polycrystalline silicon for an active layer. The polycrystalline silicon is better in a charge mobility property or the like than the amorphous silicon, and thus a TFT including the polycrystalline silicon is used for a display device requiring a high performance such as a high resolution or the like.

The polycrystalline silicon may be generally formed using an excimer laser annealing (ELA) method. In this case, there is a problem that a protrusion as a defect is produced at a grain boundary.

BRIEF SUMMARY

Accordingly, the present disclosure is directed to a TFT substrate and a display device including the same that substantially obviate one or more of the problems due to limitations and disadvantages of the related art.

An advantage of the present disclosure is to provide a TFT substrate and a display device including the same which can improve a property of a TFT including a polycrystalline silicon.

Additional features and advantages of the disclosure will be set forth in the description which follows, and in part will be apparent from the description, or may be learned by practice of the disclosure. These and other advantages of the disclosure will be realized and attained by the structure particularly pointed out in the written description and claims hereof as well as the appended drawings.

To achieve these and other advantages and in accordance with the purpose of the present disclosure, as embodied and broadly described herein, a thin film transistor (TFT) substrate includes: a TFT on a substrate, wherein the TFT includes an active patterned layer which is made of a polycrystalline silicon, which includes a channel portion, a source portion and a drain portion, and in which protrusions are formed at boundaries between grains and recess spaces are formed between the protrusions; a barrier pattern film which fills the recess spaces and forms a flat surface with the protrusions; a gate electrode which is on a gate insulating layer located on the barrier pattern film and the protrusions and overlays or corresponds to the channel portion; and a source electrode and a drain electrode which are on the gate electrode and respectively contact the source portion and the drain portion.

In another aspect, a display device includes: a thin film transistor (TFT) substrate which includes a TFT on a substrate; and a first electrode connected to a drain electrode of the TFT, wherein the TFT includes: an active patterned layer which is made of a polycrystalline silicon, which includes a channel portion, a source portion and a drain portion, and in which protrusions are formed at boundaries between grains and recess spaces are formed between the protrusions; a barrier pattern film which fills the recess spaces and forms a flat surface with the protrusions; a gate electrode which is on a gate insulating layer located on the barrier pattern film and the protrusions and overlays or corresponds to the channel portion; and a source electrode and the drain electrode which are on the gate electrode and respectively contact the source portion and the drain portion.

It is to be understood that both the foregoing general description and the following detailed description are exemplary and explanatory and are intended to provide further explanation of the described embodiments of the disclosure.

BRIEF DESCRIPTION OF THE SEVERAL VIEWS OF THE DRAWINGS

The accompanying drawings, which are included to provide a further understanding of the disclosure and are incorporated in and constitute a part of this specification, illustrate embodiments of the disclosure and together with the description serve to explain the principles of the described embodiments of the disclosure. In the drawings.

DETAILED DESCRIPTION

Reference will now be made in detail to exemplary embodiments, examples of which are illustrated in the accompanying drawings. The same reference numbers may be used throughout the drawings to refer to the same or like parts.

A TFT substrate of an embodiment of the present disclosure may be applied to all sorts of electronic devices using a TFT as a driving element. For example, a TFT substrate may be applied to various electronic devices including a display device, a sensor panel, and the like.

For the purpose of explanations, an embodiment of the present disclosure is described with a TFT substrate used for an OLED display device by way of example.

Figure 1:
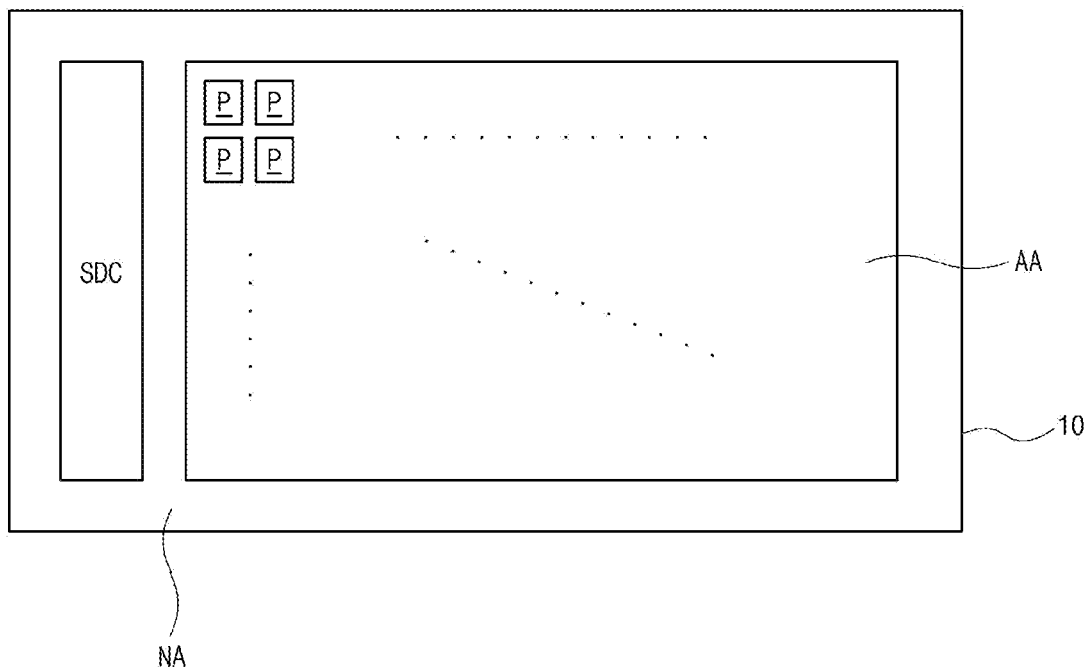
FIG. 1 is a plan view schematically illustrating a TFT substrate of an OLED display device according to an embodiment of the present disclosure.
Figure 2:
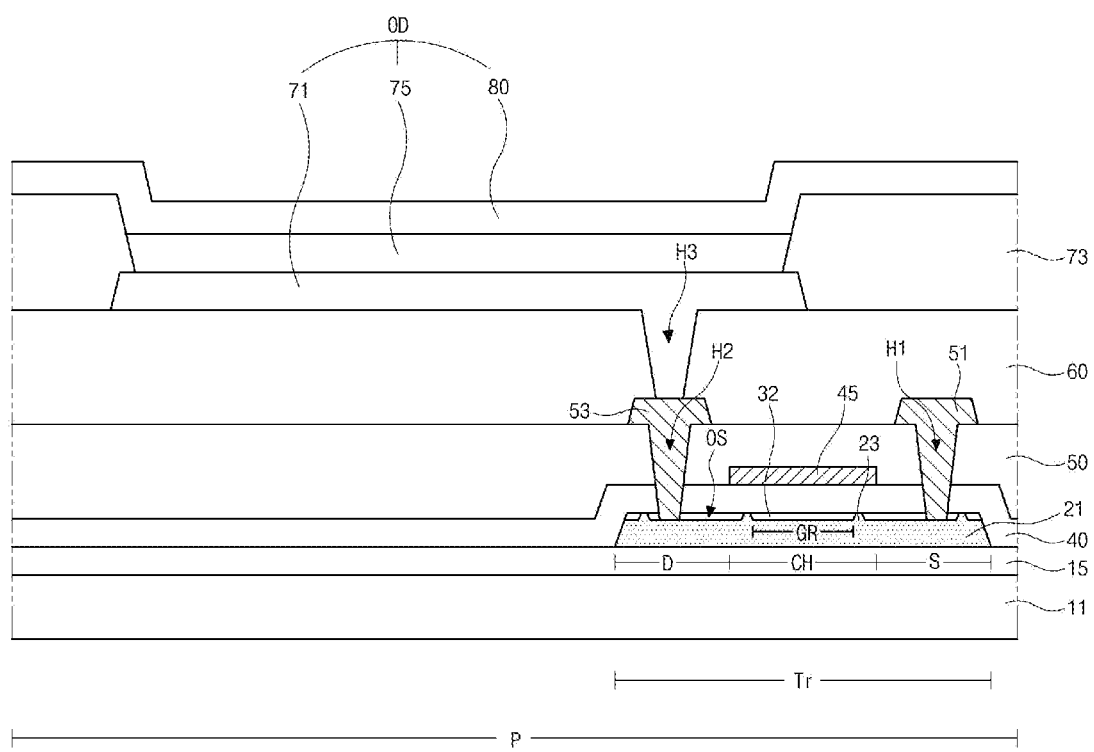
FIG. 2 is a cross-sectional view schematically illustrating a portion of a pixel region of FIG. 1.
Figure 3:
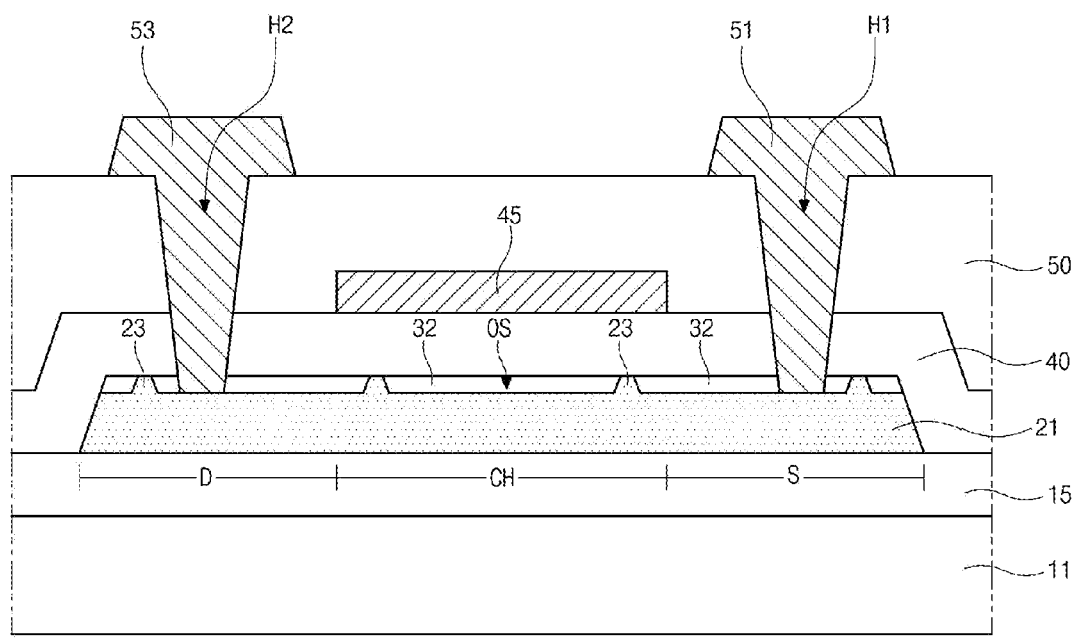
FIG. 3 is a view enlarging a TFT of FIG. 2.

FIG. 1 is a plan view schematically illustrating a TFT substrate of an OLED display device according to an embodiment of the present disclosure. FIG. 2 is a cross-sectional view schematically illustrating a portion of a pixel region of FIG. 1. FIG. 3 is a view enlarging a TFT of FIG. 2.

Referring to FIGS. 1 to 2, the TFT 10 of this embodiment may include a display region AA as an active region to display an image, and a non-display region NA as a non-active region which is located around (or surrounds) the display region AA In the display region AA, a plurality of pixel regions P may be arranged in a matrix form. The plurality of pixel regions P may include, for example, red, green and blue pixel regions P respectively displaying red, green and blue. The red, green and blue pixel regions P may be located alternately in a direction.

Each pixel region P may include driving elements to operate the pixel region P. For example, a plurality of TFTs and an organic light emitting diode OP may be formed in the pixel region P.

For the purpose of explanations, a driving TFT Tr out of the plurality of TFTs in the pixel region P is shown by way of example. The other TFTs in the pixel region P may have substantially the same structure as the driving TFT Tr.

In the non-display region NA, a driving circuit to drive the pixel regions P in the display region AA may be located.

For example, a scan driving circuit SDC which outputs a scan signal such as a gate signal and provides the scan signal to the pixel region P may be located in the non-display region NA. The scan driving circuit SDC may be formed directly in the TFT substrate 10.

The scan driving circuit SDC formed directly in the TFT substrate 10 may be referred to as a GIP (gate in panel) type driving circuit, which may be formed in processes of manufacturing the TFT substrate 10. The GIP type scan driving circuit SDC may include a plurality of TFTs for a driving circuit, and the plurality of TFTs may have substantially the same structure as the driving TFT Tr of the pixel region P.

A structure of the pixel region P is explained in detail with reference to FIGS. 2 and 3.

The TFT substrate 10 is a substrate where array elements to operate the display device are formed and may be referred to as an array substrate In the TFT substrate 10, a plurality of TFTs including the driving TFT Tr may be formed in each pixel region P on an inner surface of a substrate 11.

Each of the plurality of TFTs including the driving TFT Tr may include an active patterned layer (or semiconductor patterned layer) 21.

A buffer layer 15 may be formed below the active patterned layer 21 and entirely over the substrate 11.

The active patterned layer 21 may be made of a polycrystalline silicon.

For example, a laser annealing method such as an ELA method may be applied to an amorphous silicon deposited on the buffer layer 15 to perform a crystallization, and thus a polycrystalline silicon layer may be produced.

In the crystallization, an amorphous silicon is melted, and grains GR are grown in a lateral direction parallel with a surface of a substrate. Accordingly, the crystallization is performed.

At boundaries between the grains GR, i.e., grain boundaries, the grains GR are uplifted by the lateral growth and thus protrusions having an upwardly peaky (or upwardly sharp) shape are produced.

The protrusion may serve as a defect causing a gate voltage variation or the like due to its electric field concentration effect.

In this embodiment, the protrusions are removed from the polycrystalline silicon layer as much as possible using a polishing process such as a CMP (chemical mechanical polishing) process, and thus a property of the TFT can be improved.

In this regard, at the boundaries between the grains GR of the active patterned layer 21 which is formed through patterning the polycrystalline silicon layer, residual protrusions 23 which are partially removed through the CMP process are formed. Since the residual protrusions 23 are formed by the CMP process, top surfaces of the residual protrusions 23 are substantially flat (or even).

In the active patterned layer 21, recess spaces OS which are surrounded by the residual protrusions 23 and are dented downwardly may be defined. The recess space OS may have side surfaces of the residual protrusions 23 and a top surface of the grain GR as its boundary surfaces, and may be open upwardly.

The active patterned layer 21 may have an uneven (or concavo-convex) shape with the residual protrusions 23 and the recess spaces OS arranged alternately.

The recess space OS of the active patterned layer 21 may be filled with a barrier film as an insulating film, i.e., a barrier pattern film 32. The barrier pattern film 32 may be made of an inorganic insulating material, for example, silicon oxide $SiO_2$ or silicon nitride SiNx.

The barrier pattern film 32 is a residual barrier film that does not remove and remains on the polycrystalline silicon layer after the CMP process.

In this regard, the barrier film is formed on the polycrystalline silicon layer in which peaky protrusions are formed before the CMP process, and the CMP process is conducted for the TFT substrate 10 having this barrier film.

The CMP process may be conducted to the extent that the peaky protrusions of the polycrystalline silicon layer are partially removed and a top surface of the TFT substrate 10 are substantially in a uniformly even state. Further, a process of patterning the polycrystalline silicon layer may be conducted after the CMP process to form the active patterned layer 21 and the barrier pattern film 32.

Accordingly, for the active patterned layer 21, the residual protrusion 23 which is reduced in height (or thickness) by the polishing is formed at the boundary between the grains GR, and the barrier pattern film 32 as a residual barrier film which is partially removed by the polishing remains in the recess space OS.

As such, since the protrusion and the barrier film are partially removed by the CMP process, the active patterned layer 21 in a state that the barrier pattern film 32 remains after the CMP process substantially has an entirely flat top surface.

In other words, after the CMP process is finished, the top surface of the residual protrusion 23 is not covered by the barrier pattern film 32 to be exposed, and the side surface of the residual protrusion 23 substantially entirely contacts the barrier pattern film 32. The barrier pattern film 32 remains to substantially fully fill the recess space OS on the side surface of the residual protrusion 23 so that the top surface of the barrier pattern film 32 has substantially the same height as the top surface of the residual protrusion 23.

Since the recess space OS of the active patterned layer 21 is filled with the barrier pattern film 32, the top surface of the active patterned layer 21 substantially has a flat form.

When conducting the CMP process, the grains GR of the active pattern layer 21 are not affected by the CMP because of the barrier pattern film 32 remaining thereon. Accordingly, the grains GR being exposed to the CMP and thus being damaged can be substantially prevented.

Accordingly, an influence of the CMP on the grains GR can be prevented while the protrusions being partially removed, thus a defect of the active patterned layer 21 can be minimized, and thus a property of the TFT can be maximized.

The active patterned layer 21 of the driving TFT Tr may include a channel portion CH, and a source portion S and a drain portion D respectively located at both sides of the channel portion CH.

The channel portion CH may be a non-doped portion, which is not doped with impurities, as a pure silicon region. The source portion S and the drain portion D may be a doped portion which is highly doped with impurities, for example, P (positive) or N (negative) type impurities according to a type of the TFT.

A gate insulating layer 40 may be formed on a substantially entire surface of the substrate 11 having the active patterned layer 21.

The gate insulating layer 40 may be made of an inorganic insulating material, for example, silicon oxide ($SiO_2$) or silicon nitride (SiNx). It is preferable, but not limited, that the gate insulating layer 40 is made of the same material as the barrier pattern film 32 therebelow. When the gate insulating layer 40 is made of the same material as the barrier pattern film 32, an effect such as an improved adhesion property therebetween may be achieved.

In the gate insulating layer 40, a first contact hole H1 and a second contact hole H2 respectively exposing the source portion S and the drain portion D of the active patterned layer below the gate insulating layer 40 may be formed.

At portions where the first contact hole H1 and the second contact hole H2 are formed, i.e., at a region of a part of the source portion S and a region of a part of the drain portion D, the barrier pattern film 32 is substantially removed entirely.

In other words, a source electrode 51 directly contacts the region of the part of the source portion S, and a drain electrode 53 directly contacts the region of the part of the drain portion D. Accordingly, it is preferable that at the region of the part of the source portion S contacting the source electrode 51 and the region of the part of the drain portion D contacting the drain electrode 53, the barrier pattern film 32 does not exist and is fully removed.

Thus, at a contact region as the region of the part of the source portion S and a contact region as the region of the part of the drain portion D, the barrier pattern film 32 is removed in the recess space OS and the top surfaces of the corresponding grains GR are in an exposed state. In other words, the top surface of the active patterned layer 21 below the first and second contact holes H1 and H2 is in an exposed state.

As such, the gate insulating layer 40 may fully cover the active patterned layer 21 except for parts of the active patterned layer 21 corresponding to the first and second contact holes H1 and H2.

In this regard, for the active patterned layer 21 except for the parts of the active patterned layer 21 corresponding to the first and second contact holes H1 and H2, the gate insulating layer 40 may be formed over the residual protrusions 23 to directly contact the residual protrusions 23, and the gate insulating layer 40 may be formed over the grains GR with the barrier pattern film 32 interposed therebetween.

Further, side surfaces of the active patterned layer 21 may directly contact and be covered by the gate insulating layer 40.

The gate insulating layer 40 may be formed on the active patterned layer 21 which has a substantially flat state because of the barrier pattern film 32. Thus, the gate insulating layer 40 on the active patterned layer 21 may also have a substantially flat state.

Accordingly, a gate electrode 45 on the gate insulating layer 40 may also have a substantially flat state, and thus a stable property of the TFT can be obtained.

Further, as a resolution of a display device increases, a size of the TFT is reduced and the gate insulating layer 40 is required to have a small thickness. In this case, if the barrier pattern film 32 does not exist and the gate insulating layer 40 having a small thickness is deposited on the active patterned layer 21 with peaky protrusions not being removed, there may happen a defect that the peaky protrusions penetrate the gate insulating layer 40 and contact the gate electrode 45.

However, in this embodiment, with the barrier pattern film 32 being formed below the gate insulating layer 40, the top surface of the active patterned layer 21 substantially becomes flat. Thus, it can be prevented that the residual protrusions 23 of the active patterned layer 21 penetrate the gate insulating layer 40 and contact the gate electrode 45 to make a short-circuit.

Accordingly, a defect of the TFT caused by the short-circuit between the protrusions of the active patterned layer 21 and the gate electrode 45 can be prevented.

The gate electrode 45 may be formed on the gate insulating layer 40 to substantially overlie or correspond to the channel portion CH.

As described above, the gate insulating layer 40 has a substantially flat surface on the active patterned layer 21, and thus the gate electrode 45 may be formed to be substantially flat.

A first passivation layer 50 as an insulating layer may be formed on the gate electrode 45. The first passivation layer 50 may be made of an inorganic insulating material or organic insulating material.

The first passivation layer 50 may include the first and second contact holes H1 and H2 respectively exposing the source and drain portions S and D.

The source and drain electrodes 51 and 53 may be formed on the first passivation layer 50 to be spaced apart from each other with the gate electrode 45 located therebetween.

The source electrode 51 may be connected to the source portion S through the first contact hole H1, and the drain electrode 53 may be connected to the drain portion D through the second contact hole H2.

In an etching process to form the first and second contact holes H1 and H2 in the first passivation layer 50 and the gate insulating layer 40, removing the barrier pattern film 32 in the regions of the source and drain portions S and D below the first and second contact holes H1 and H2 may be conducted.

Accordingly, the source electrode 51 may stably contact the source portion S of the active patterned layer 21, and the drain electrode 53 may stably contact the drain portion D of the active patterned layer 21.

The active patterned layer 21, the gate electrode 45, and the source and drain electrodes 51 and 53 form the driving TFT Tr.

A second passivation layer 60 as an insulating layer may be formed on the source and drain electrodes 51 and 53, as seen in FIG. 2.

The second passivation layer 60 may be made of an inorganic insulating material or organic insulating material.

The second passivation layer 60 may include a third contact hole H3 exposing the drain electrode 53.

A first electrode 71 may be formed on the second passivation layer 60 and be patterned to correspond to each pixel region P.

A bank 73 may be formed on the first electrode 71 to cover edge portions of the first electrode 71 and separate the pixel regions P.

An organic light emitting layer 75 may be formed on the first electrode 71 and in an opening of the bank 73.

A second electrode 80 may be formed on the organic light emitting layer 75 and entirely over the substrate 11.

The first electrode 71, the organic light emitting layer 75 and the second electrode 80 form an organic light emitting diode OD. One of the first and second electrodes 71 and 80 serves as an anode, and the other of the first and second electrodes 71 and 80 serves as a cathode.

One of the first and second electrodes 71 and 80 may be made of a transparent conductive material according to an emission type of the display device. For example, in a case of a bottom emission type display device, the first electrode 71 may be transparent, and in a case of a top emission type display device, the second electrode 80 may be transparent.

When an LCD is used as the display device, a switching TFT having the same structure as the driving TFT Tr described above may be formed in a pixel region, and a pixel electrode corresponding to the first electrode 71 described above may be connected to a drain electrode of the switching TFT.

A method of manufacturing the TFT substrate of this embodiment is explained with reference to FIGS. 4 to 7.

Figure 4:
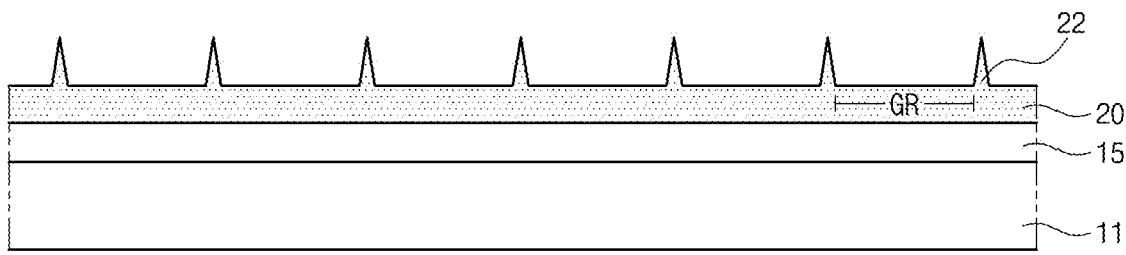
FIGS. 4 to 7 are cross-sectional views illustrating a method of manufacturing a TFT substrate according to an embodiment of the present disclosure.

Referring to FIG. 4, a buffer layer 15 is formed on a substrate 11, and an amorphous silicon layer is formed on the buffer layer 15. After forming the amorphous silicon layer, a dehydrogenation using a heat treatment may be conducted.

Then, a laser annealing process is conducted for the amorphous silicon layer to crystallize the amorphous silicon layer, and thus a polycrystalline silicon layer 20 is formed.

In the crystallization process, grains GR are grown laterally, and thus protrusions 22 which protrude in an upward direction from the substrate 11 are formed at boundaries between the grains GR.

In this regard, the polycrystalline silicon layer 20 may have a thickness, for example, 500 Å or less, and the protrusions 22 may have a thickness, for example, but not limited to, 500 Å to 1000 Å.

Figure 5:
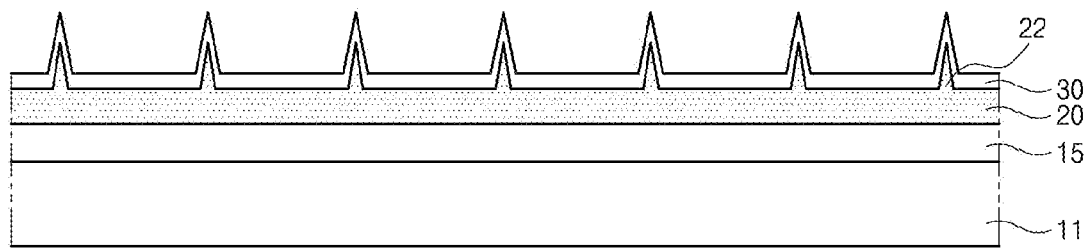

Then, referring to FIG. 5, a barrier film 30 is formed on the polycrystalline silicon layer 20. The barrier film 30 may be made of an inorganic insulating material, for example, silicon oxide ($SiO_2$) or silicon nitride (SiNx).

The barrier film 30 may have a thickness, for example, but not limited to, 200 Å to 300 Å.

Since a surface state of the polycrystalline silicon layer 20 is reflected in the barrier film 30, the barrier film 30 is formed to have protrusions corresponding to the protrusions 22 of the polycrystalline silicon layer 20.

Figure 6:
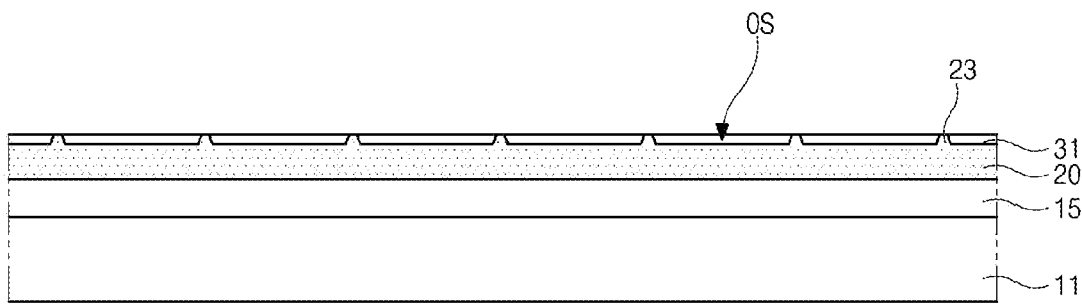

Then, referring to FIG. 6, a CMP process is conducted for the substrate 11 having the barrier film 30 to planarize the substrate 11.

In the CMP process, a surface of the substrate 11 is polished using a polishing pad of a CMP apparatus in a state that a slurry is provided on the surface of the substrate 11.

The CMP process may be conducted such that a part of the barrier film 30 remains. When the CMP process is finished, a residual barrier film 31 as the barrier film 30 which is removed partially in a thickness direction and residual protrusions 23 as the protrusions 22 which are removed partially in a thickness direction are formed.

A surface of the residual barrier film 31 and surfaces of the residual protrusions 23 are substantially equal in height, and thus the substrate 11 having the residual barrier film 31 and the residual protrusions 23 has a substantially flat surface.

In other words, the recess space OS between the residual protrusions 23, i.e., a space on the grain GR is filled with the residual barrier film 31, and the residual protrusion 23 is exposed to the outside.

In this regard, the residual protrusions 23 and the residual barrier film 31 remaining have a thickness, for example, but not limited to, 200 Å to 300 Å.

As described above, in this embodiment, the CMP process is conducted in a state that the surface of the polycrystalline silicon layer 20 having the protrusions 22 is covered by the barrier film 30. Thus, a damage of the grains GR by the CMP can be prevented, and the protrusions 22 of the polycrystalline silicon layer 20 can be removed partially.

Accordingly, a defect of the polycrystalline silicon layer 20, i.e., a defect of an active patterned layer 21, which is formed by patterning the polycrystalline silicon layer 20, can be minimized, and thus a property of a TFT can be maximized.

Further, since the surface of the polycrystalline silicon layer 20 having the residual barrier film 31 formed thereon is substantially flat with the residual protrusions 23 not coming out upwardly, a defect of the active patterned layer 21 and a gate electrode 45 being short-circuited by the protrusions in a later process can be prevented.

Figure 7:
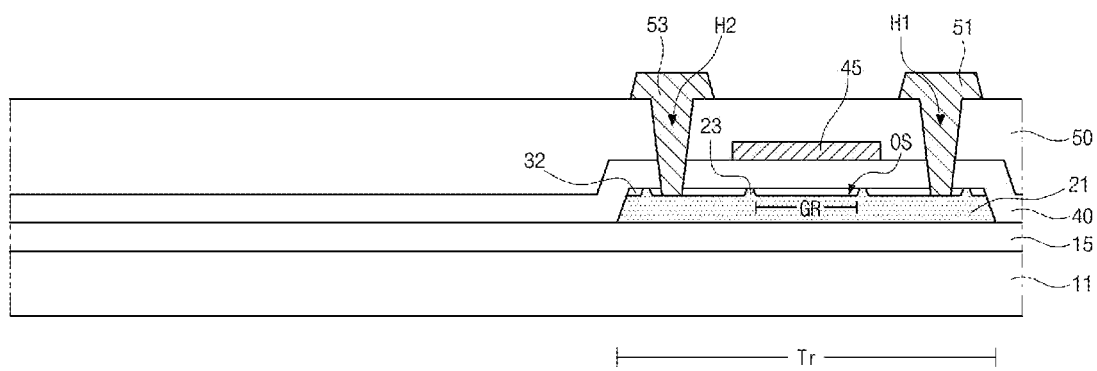

Then, referring to FIG. 7, a mask process is conducted for the polycrystalline silicon layer 20 and the residual barrier film 31 to pattern them. Accordingly, the active patterned layer 21 is formed in the pixel region P, and the barrier pattern film 32 having substantially the same shape in plane as the active patterned layer 21 is formed.

Then, a gate insulating layer 40 is formed on the active patterned layer 21 and entirely over the substrate 11, and the gate electrode 45 is formed on the gate insulating layer 40 corresponding to a channel portion CH of the active patterned layer 21. The gate electrode 45 may be made of a conductive material including a metal.

The gate insulating layer 40 may be made of an inorganic insulating material, for example, silicon oxide ($SiO_2$) or silicon nitride (SiNx). The gate insulating layer 40 may be made of the same material as the barrier pattern film 32.

The gate insulating layer 40 may entirely cover the active patterned layer 21 having the barrier pattern film 32 thereon.

Accordingly, the gate insulating layer 40 is stacked on the residual protrusions 23 to directly contact the residual protrusions 23, and the barrier pattern film 32 and the gate insulating layer 40 are stacked on the grains GR at sides of the residual protrusions 23.

Side surfaces of the active patterned layer 21 may be slanted at a predetermined angle with a surface of the substrate 11 because of the mask process to form the active patterned layer 21, and may directly contact and be covered by the gate insulating layer 40.

Then, a doping process is conducted to dope source and drain portions S and D of the active patterned layer 21 with impurities. In the doping process, the gate electrode 45 may serve as a doping mask.

Then, a first passivation layer 50 may be formed on the gate electrode 45 and entirely over the substrate 11.

Then, a mask process is conducted for the first passivation layer 50 to form first and second contact holes H1 and H2.

In this mask process, etching the first passivation layer 50, the gate insulating layer 40 and the barrier pattern film 32 may be conducted. Accordingly, the first passivation layer 50 and the gate insulating layer 40 are etched to form the first and second contact holes H1 and H2, and the barrier pattern film 32 remaining at a region of a part of the source portion S and a region of a part of the drain portion D is etched and fully removed.

Then, a source electrode 51 and a drain electrode 53 may be formed on the first passivation layer 50 and be made of a conductive material including a metal.

The source electrode 51 may be stably connected to the substantially entire region of the part of the source portion S below the first contact hole H1 through the first contact hole H1, and the drain electrode 53 may be stably connected to the substantially entire region of the part of the drain portion D below the second contact hole H2 through the second contact hole H2.

Through the above processes, a driving TFT Tr is formed in the pixel region P of the TFT substrate 10, and at least one TFT, having substantially the same structure as the driving TFT Tr, other than the driving TFT Tr, may be formed in the pixel region P.

Then, an organic light emitting diode (OD of FIG. 2) connected to the driving TFT Tr is formed at the TFT substrate 10.

The TFT(s), which may be referred to as a TFT(s) for a pixel, formed in the pixel region P is described above by way of example, and the structure of the TFT may be applied equally to a TFT(s), which may be referred to as a TFT(s) for a driving circuit, formed in a GIP type scan driving circuit (SDC of FIG. 1).

Figure 8:
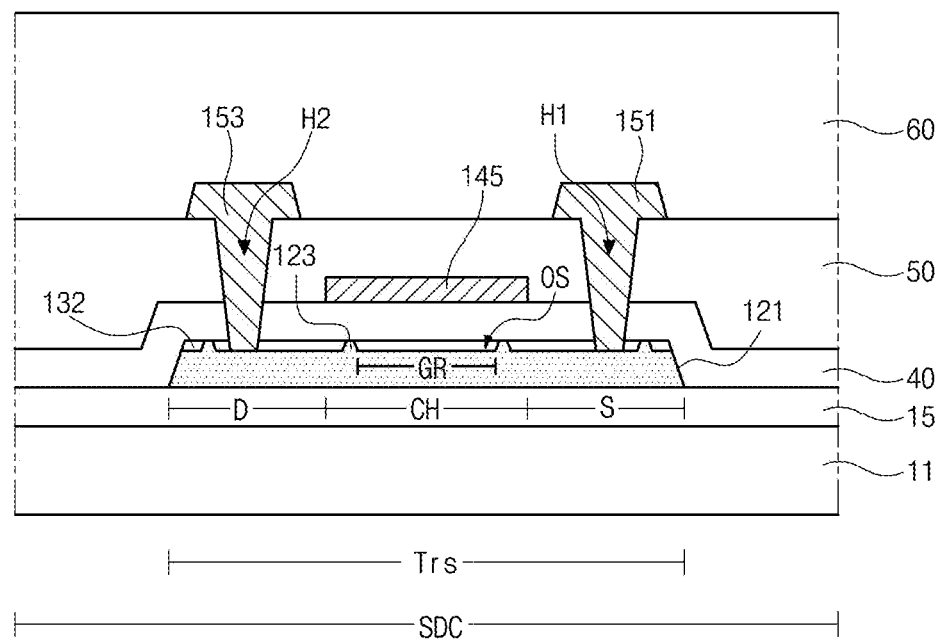
FIG. 8 is a cross-sectional view schematically illustrating a structure of a TFT for a driving circuit formed in a scan driving circuit according to an embodiment of the present disclosure.

This refers to FIG. 8 which is a cross-sectional view schematically illustrating a structure of a TFT for a driving circuit formed in a scan driving circuit according to an embodiment of the present disclosure.

Referring to FIG. 8, a TFT Trs for a driving circuit may be formed to have the same structure as the TFT (Tr of FIG. 2) for a pixel.

In other words, in the TFT Trs for a driving circuit, an active patterned layer 121 is formed on the buffer layer 15. A barrier pattern film 132 is formed on the active patterned layer 121 to fill recess spaces OS between residual protrusions 123 and have the same height as the residual protrusions 123, and thus a top surface of the active patterned layer 121 having the barrier pattern film 132 is planarized.

The gate insulating layer 40 extends along an entire surface of the active patterned layer 121 and covers the active patterned layer 121 entirely.

A gate electrode 145 is formed on the gate insulating layer 40 to correspond to a channel portion CH of the active patterned layer 121.

Source and drain electrodes 151 and 153 are formed on a first passivation layer 50 located on the gate electrode 145.

In the first passivation layer 50 and the gate insulating layer 30, a first contact hole H1 to connect the source electrode 151 and a source portion S and a second contact hole H2 to connect the drain electrode 153 and a drain portion D are formed.

The barrier pattern film 32 at a region of a part of the source portion S below the first contact hole H1 is substantially fully removed, and the barrier pattern film 32 at a region of a part of the drain portion S below the second contact hole H2 is substantially fully removed A second passivation layer 60 is formed on the source and drain electrodes 151 and 153.

The active patterned layer (21 of FIG. 2) described above as a semiconductor layer for a TFT may be applied similarly as a conductive connection patterned layer.

Figure 9:
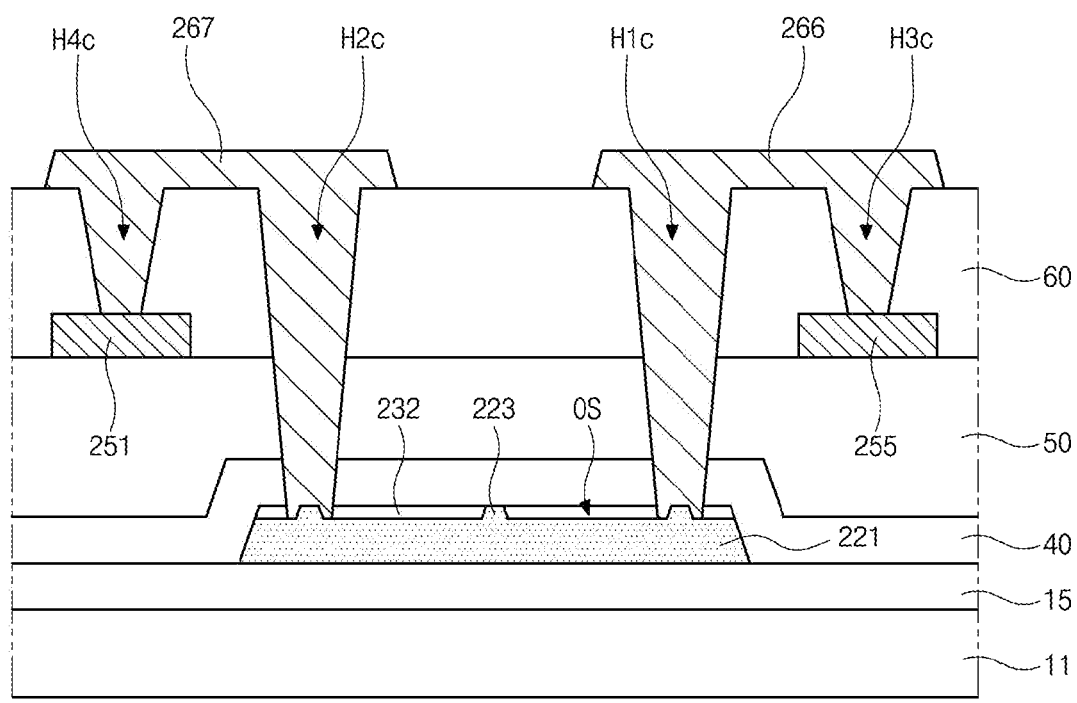
FIG. 9 is a cross-sectional view schematically illustrating an example a conductive connection patterned layer using a polycrystalline silicon according to an embodiment of the present disclosure.

An example of this is explained with reference to FIG. 9. FIG. 9 shows that a first metal patterned layer 255 and a second metal patterned layer 251 are formed at a TFT substrate, and a driving signal is transferred from one of the first and second metal patterned layers 255 and 251 to the other of the first and second metal patterned layers 255 and 251.

The first and second metal patterned layers 255 and 251 may be formed at the same layer, and it is assumed that the first metal patterned layer 255 is a power line to supply a power voltage, the second metal patterned layer 251 is a source electrode of a driving TFT supplied with the power voltage, and the first and second metal patterned layers 255 and 251 located at the same layer are not connected directly to each other because a large number of array elements are arranged at the TFT substrate.

A conductive connection patterned layer 221 may be formed such that the conductive connection patterned layer 221 is located with at least one insulating layer (e.g., the gate insulating layer 40 and the first passivation layer 50) between the conductive connection patterned layer 221 and the first and second metal patterned layers 255 and 251, and electrically connects the first and second metal patterned layers 255 and 251.

The conductive connection patterned layer 221 may be formed of a polycrystalline silicon doped with impurities like the source or drain portion (S or D of FIG. 2) of the active patterned layer (21 of FIG. 2) of the TFT to substantially have a conductivity to transfer an electrical signal.

Similarly to the active patterned layer of the TFT, the conductive connection patterned layer 221 may have residual protrusions 223, and a barrier pattern film 232 may be formed in recess spaces OS between the protrusions 223.

The conductive connection patterned layer 221 is located in a signal transfer path between the first and second metal patterned layers 255 and 251 to electrically connect them.

Further, a first connection electrode 266 may be formed to connect the first metal patterned layer 255 to the conductive connection pattern 221, and a second connection electrode 267 may be formed to connect the second metal patterned layer 251 to the conductive connection patterned layer 221.

In this case, a first connection contact hole Hic to connect the first connection electrode 266 to the conductive connection patterned layer 221 may be formed in at least one insulating layer (e.g., the gate insulating layer 40, and the first and second passivation layers 50 and 60) between the first connection electrode 266 and the conductive connection patterned layer 221, and a second connection contact hole H2c to connect the second connection electrode 267 to the conductive connection patterned layer 221 may be formed in at least one insulating layer (e.g., the gate insulating layer 40, and the first and second passivation layers 50 and 60) between the second connection electrode 267 to the conductive connection patterned layer 221. The barrier pattern film 232 at regions of parts of the conductive connection patterned layer 221 below the first and second connection contact holes H1c and H2c are fully removed to stably contact the first and second connection electrodes 266 and 267.

Further, a third connection contact hole H3c to connect the first connection electrode 266 to the first metal patterned layer 255 may be formed in at least one insulating layer (e.g., the second passivation layer 60) between the first connection electrode 266 and the first metal patterned layer 255, and a fourth connection contact hole H4c to connect the second connection electrode 267 to the second metal patterned layer 251 may be formed in at least one insulating layer (e.g., the second passivation layer 60) between the second connection electrode 267 to the second metal patterned layer 251.

The first and second metal patterned layers 255 and 251 being located at the same layer is described above by way of example. Alternatively, the first and second metal patterned layers 255 and 251 may be located at different layers with at least one insulating layer interposed therebetween. The first and second metal patterned layers 255 and 251 may be configured to directly contact the conductive connection patterned layer 221 without using corresponding connection electrodes.

In the above embodiment, the CMP process is conducted in a state that the surface of the polycrystalline silicon layer having the protrusions is covered by the barrier film. Thus, a damage of the grains GR by the CMP can be prevented, and the protrusions of the polycrystalline silicon layer can be removed partially.

Accordingly, a defect of the polycrystalline silicon layer can be minimized, and thus a property of a TFT can be maximized.

Further, since the surface of the polycrystalline silicon layer having the barrier film formed thereon is substantially flat with the residual protrusions not coming out upwardly, a defect of the active patterned layer and the gate electrode being short-circuited by the protrusions in a later process can be prevented and a property of a TFT can be secured.

It will be apparent to those skilled in the art that various modifications and variation can be made in the present disclosure without departing from the spirit or scope of the disclosure. Thus, it is intended that the present disclosure cover the modifications and variations of the described embodiments in this disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A thin film transistor (TFT) substrate, comprising:
a buffer layer on a substrate having a first region and a second region;
an active patterned layer of a polycrystalline silicon including a channel portion, a source portion, and a drain portion, the active patterned layer including a plurality of protrusions at boundaries between grains and a plurality of recess spaces, each of the plurality of recess spaces formed on a respective portion between adjacent protrusions of the plurality of protrusions, at least one protrusion of the plurality of protrusions having a flat top surface, the active patterned layer disposed on the buffer layer and in the first region;
a connection patterned layer of a polycrystalline silicon doped with impurities and having a plurality of other protrusions and a plurality of other recess spaces, at least one other protrusion of the plurality of other protrusions having a flat top surface, the connection patterned layer disposed on the buffer layer and the second region;
a first barrier pattern film filling the plurality of recess spaces, the first barrier pattern film having a top surface that is coplanar with the flat top surface of the at least one protrusion of the active patterned layer;
a second barrier pattern film filling the plurality of other recess spaces of the connection patterned layer;
a gate insulating layer disposed to overlap the first region of the substrate and the second region of the substrate, a bottom surface of the gate insulating layer covering the first barrier pattern film and the second barrier pattern film and overlying the plurality of protrusions of the active patterned layer and the plurality of other protrusions of the connection patterned layer, the bottom surface of the gate insulating layer being coplanar with the top surface of the first barrier pattern film and the flat top surface of the at least one protrusion of the active patterned layer throughout a portion that overlaps the active patterned layer, the bottom surface of the gate insulating layer being coplanar with the top surface of the second barrier pattern film and the flat top surface of the at least one other protrusion of the connection patterned layer throughout a portion that overlaps the connection patterned layer;
a gate electrode on the gate insulating layer, and the gate electrode overlaying the channel portion; and
a first passivation layer on the gate electrode in the first region and on the gate insulating layer in the second region;
a source electrode and a drain electrode on the first passivation layer and respectively contacting the source portion and the drain portion;
a metal pattern on the first passivation layer;
a second passivation layer on the source electrode, the drain electrode and the metal pattern;
a first connection contact hole through the gate insulating layer, the first passivation layer and the second passivation layer to expose a first portion of the connection patterned layer,
a second connection contact hole through the gate insulating layer, the first passivation layer and the second passivation layer to expose a second portion of the connection patterned layer;
a third connection contact hole through the second passivation layer to expose a portion of the source electrode;
a fourth connection contact hole through second passivation layer to expose the metal pattern;
a first connection electrode on the second passivation layer, the first connection electrode directly contacting the first portion of connection patterned layer through the first connection contact hole and the portion of the source electrode through the third connection contact hole; and
a second connection electrode on the second passivation layer, the second connection electrode directly contacting the second portion of connection patterned layer through the second connection contact hole and the portion of the metal pattern through the fourth connection contact hole,
wherein the gate insulating layer is disposed on the active patterned layer and below the gate electrode,
wherein the gate insulating layer has a constant first thickness at the first region defined between the source electrode and the drain electrode and a second thickness in the second region of the substrate,
wherein the second region includes a region excluding the first region, wherein the first thickness is equal to the second thickness, and wherein the bottom surface of the gate insulating layer in the first region contacts a top surface of the first barrier pattern film and the flat top surface, and the bottom surface of the gate insulating layer in the second region contacts the buffer layer.

2. The TFT substrate of claim 1, wherein the gate insulating layer directly contacts the first barrier pattern film and the protrusions.

3. The TFT substrate of claim 1, further comprising: wherein the first passivation layer and the gate insulating layer include fifth and sixth contact holes respectively exposing the source and drain portions; and wherein the first barrier pattern film is removed at a part of the source portion below the first contact hole and a part of the drain portion below the second contact hole.

4. The TFT substrate of claim 1, wherein a part of the gate insulating layer on the first barrier pattern film and the protrusions is flat.

5. The TFT substrate of claim 4, wherein the gate electrode is flat.

6. The TFT substrate of claim 1, wherein the gate insulating layer covers side surfaces of the active patterned layer.

7. The TFT substrate of claim 1, wherein the substrate includes an active region where a plurality of pixel regions are arranged, and
wherein a TFT including the active patterned layer, the first barrier pattern film, the gate insulating layer, the source electrode and the drain electrode is formed in one of the plurality of pixel regions.

8. The TFT substrate of claim 7, wherein the substrate includes a non-active region around the active region, and
wherein another TFT is formed in a driving circuit in the non-active region.

9. The TFT substrate of claim 1, further comprising:
wherein the second barrier pattern film is removed at a part of the connection patterned layer below the first connection contact hole and a part of the connection patterned layer below the second connection contact hole.

10. The thin film transistor of claim 1, wherein the top surface of the first barrier pattern film is flush with the flat top surface of the at least one of the protrusion of the active patterned layer.

11. The thin film transistor of claim 1, wherein the first barrier pattern film is located only in the recess spaces of the active patterned layer.

12. The TFT substrate of claim 1, wherein the first barrier pattern film is comprised of a different material than the gate insulating layer.

13. The TFT substrate of claim 1, wherein the barrier pattern film is comprised of the same material as the gate insulating layer.

14. A display device, comprising:
a first electrode;
a substrate including a first region and a second region;
a buffer layer on the substrate;
an active patterned layer of a polycrystalline silicon including a channel portion, a source portion, and a drain portion, the active patterned layer including protrusions at boundaries between grains and recess spaces between the protrusions, at least one of the protrusions having a first side surface having a first inclination, a second side surface having a second inclination, and a third top surface extending between the first side surface and the second side surface, the active patterned layer disposed on the buffer layer and in the first region;
a connection patterned layer of a polycrystalline silicon doped with impurities and having other protrusions and other recess spaces, the connection patterned layer disposed on the buffer layer and in the second region;
a first barrier pattern film in the recess spaces of the active patterned layer and contacting the first side surface and the second side surface of the at least one of the protrusions, the first barrier pattern film not extending beyond the third top surface;
a second barrier pattern film filling the other recess spaces of the connection patterned layer;
a gate insulating layer overlapping the first region and the second region, the gate insulating layer covering the first barrier pattern film, the second barrier pattern film, the other protrusions of the connection patterned layer and the protrusions of the active patterned layer;
a gate electrode on the gate insulating layer, the gate electrode overlaying the channel portion;
a first passivation layer on the gate electrode in the first region and on the gate insulating layer in the second region;
a source electrode and the drain electrode on the first passivation layer and respectively contacting the source portion and the drain portion;
a metal pattern on the first passivation layer;
a second passivation layer on the source electrode, the drain electrode and the metal pattern;
a first connection contact hole through the gate insulating layer, the first passivation layer and the second passivation layer to expose a first portion of the connection patterned layer;
a second connection contact hole through the gate insulating layer, the first passivation layer and the second passivation layer to expose a second portion of the connection patterned layer;
a third connection contact hole through the second passivation layer to expose a portion of the source electrode;
a fourth connection contact hole through second passivation layer to expose the metal pattern;
a first connection electrode on the second passivation layer, the first connection electrode directly contacting the first portion of connection patterned layer through the first connection contact hole and the portion of the source electrode through the third connection contact hole; and
a second connection electrode on the second passivation layer, the second connection electrode directly contacting the second portion of connection patterned layer through the second connection contact hole and the portion of the metal pattern through the fourth connection contact hole,
wherein the gate insulating layer has a constant first thickness at the first region defined between the source electrode and the drain electrode and a second thickness in the second region of the substrate,
wherein the second region includes a region excluding the first region between the source electrode and the drain electrode,
wherein the first thickness is equal to the second thickness, and
wherein a bottom surface of the gate insulating layer in the first region contacts a top surface of the first barrier pattern film and the third top surface, and the bottom surface of the gate insulating layer in the second region contacts the buffer layer.

15. The display device of claim 14, wherein the gate insulating layer directly contacts the first barrier pattern film and the protrusions.

16. The display device of claim 14, further comprising:
wherein the first passivation layer and the gate insulating layer include fifth and sixth contact holes respectively exposing the source and drain portions; and
wherein the first barrier pattern film is removed at a part of the source portion below the first contact hole and a part of the drain portion below the second contact hole.

17. The display device of claim 14, wherein a part of the gate insulating layer overlapping the active patterned layer is flush with the first barrier pattern film and the protrusions.

18. The display device of claim 17, wherein the gate electrode is flat.

19. The display device of claim 14, wherein the gate insulating layer extends to cover side surfaces of the active patterned layer.

20. The display device of claim 14, wherein the substrate includes an active region where a plurality of pixel regions are arranged, and
wherein a TFT including the active patterned layer, the first barrier pattern film, the gate insulating layer, the source electrode and the drain electrode is formed in one of the plurality of pixel regions.

21. The display device of claim 20, wherein the substrate includes a non-active region around the active region, and
wherein another TFT is formed in a driving circuit in the non-active region.

22. The display device of claim 14,
wherein the second barrier pattern film is removed at a part of the connection patterned layer below the first connection contact hole and a part of the connection patterned layer below the second connection contact hole.

23. The display device of claim 14, further comprising:
an organic light emitting layer on the first electrode; and
a second electrode on the organic light emitting layer.

24. The display device of claim 14, wherein the top surface of the first barrier pattern film is flush with the third top surface of the at least one of the protrusions of the active patterned layer.

25. The display device of claim 14, wherein the first barrier pattern film is located only in the recess spaces of the active patterned layer.

* * * * *